United States Patent
Chao et al.

(10) Patent No.: US 7,157,720 B2
(45) Date of Patent: Jan. 2, 2007

(54) MULTI-MODE CHARGED PARTICLE BEAM DEVICE

(75) Inventors: Henry Shih-Ming Chao, Danville, CA (US); Colin Geoffrey Trevor, Pleasanton, CA (US); Paul Edward Mooney, Pleasanton, CA (US); Bernd Kraus, Munich (DE)

(73) Assignee: Ropintassco Holdings, L.P., Deluth, GA (US)

( * ) Notice: Subject to any disclaimer, the term of this patent is extended or adjusted under 35 U.S.C. 154(b) by 88 days.

(21) Appl. No.: 10/878,659

(22) Filed: Jun. 28, 2004

(65) Prior Publication Data

US 2005/0030373 A1   Feb. 10, 2005

Related U.S. Application Data

(60) Provisional application No. 60/492,138, filed on Aug. 1, 2003.

(51) Int. Cl.
*G01K 1/08* (2006.01)
*H01J 3/14* (2006.01)
*H01J 3/26* (2006.01)
*G01N 23/00* (2006.01)
*G21K 7/00* (2006.01)

(52) U.S. Cl. ........................ 250/397; 250/311
(58) Field of Classification Search ............ 250/311, 250/397
See application file for complete search history.

(56) References Cited

U.S. PATENT DOCUMENTS

| 4,185,906 A | * | 1/1980 | Little ......................... 396/502 |
| 4,498,105 A | | 2/1985 | Crawshaw et al. |
| 4,799,108 A | * | 1/1989 | Gerner ....................... 348/317 |
| 4,851,670 A | | 7/1989 | Krivanek |
| 5,065,029 A | | 11/1991 | Krivanek |
| 5,097,126 A | | 3/1992 | Krivanek |
| 5,536,941 A | | 7/1996 | Swann |
| 5,569,925 A | * | 10/1996 | Quinn et al. ........... 250/370.06 |
| 5,578,823 A | | 11/1996 | Taniguchi et al. |
| 5,892,231 A | * | 4/1999 | Baylor et al. ............... 250/398 |
| 5,896,172 A | * | 4/1999 | Korthout et al. ............ 348/248 |
| 5,946,033 A | | 8/1999 | Mooney et al. |
| 5,981,948 A | * | 11/1999 | Taniguchi et al. .......... 250/311 |

OTHER PUBLICATIONS

Nestor J. Zaluzec et al.; Two-Dimensional CCD Arrays As Parallel Detectors In Electron-Energy-Los and X-Ray Wavelength-Dispersive Spectroscopy; Ultramicroscopy 28, 1989, pp. 131-136; North-Holland, Amsterdam.

"Galan Imaging Filter"; Internet Publication: http:/www.gatan.com; @ 2001 Gatan, Inc.

"Enfina 1000"; Internet Publication: http:/www.gatan.com; @ 2000 Gatan, Inc.

"Multiscan"; Internet Publication: http:/www.gatan.com; @ 2002 Gatan, Inc.

(Continued)

*Primary Examiner*—Jack Berman
*Assistant Examiner*—Jennifer Yantorno
(74) *Attorney, Agent, or Firm*—Dinsmore & Shohl LLP

(57) ABSTRACT

A charged particle device is provided comprising a charged particle source configured to direct charged particles in the direction of a specimen under examination and an imaging device configured to convert charged particles to an image representing the specimen. The imaging device comprises a detector defining a pixel array. The detector is configured to generate electric charges for individual pixels of the pixel array such that the electric charges collectively define the image. The imaging device is configured such that a portion of the pixel array can be transitioned between a partially masked state and a substantially unmasked state.

22 Claims, 7 Drawing Sheets

OTHER PUBLICATIONS

Mortimer Abromowitz, Kirill I. Tchourioukanov and Michael W. Davidson; "Full-Frame CCD Operation"; Internet Publication: www.microscopy.fsu.edu; Jul. 21, 2003.

Mortimer Abromowitz, Kirill I. Tchourioukanov and Michael W. Davidson; "Frame-Transfer CCD Operation"; Internet Publication: www.microscopy.fsu.edu; Jul. 21, 2003.

* cited by examiner

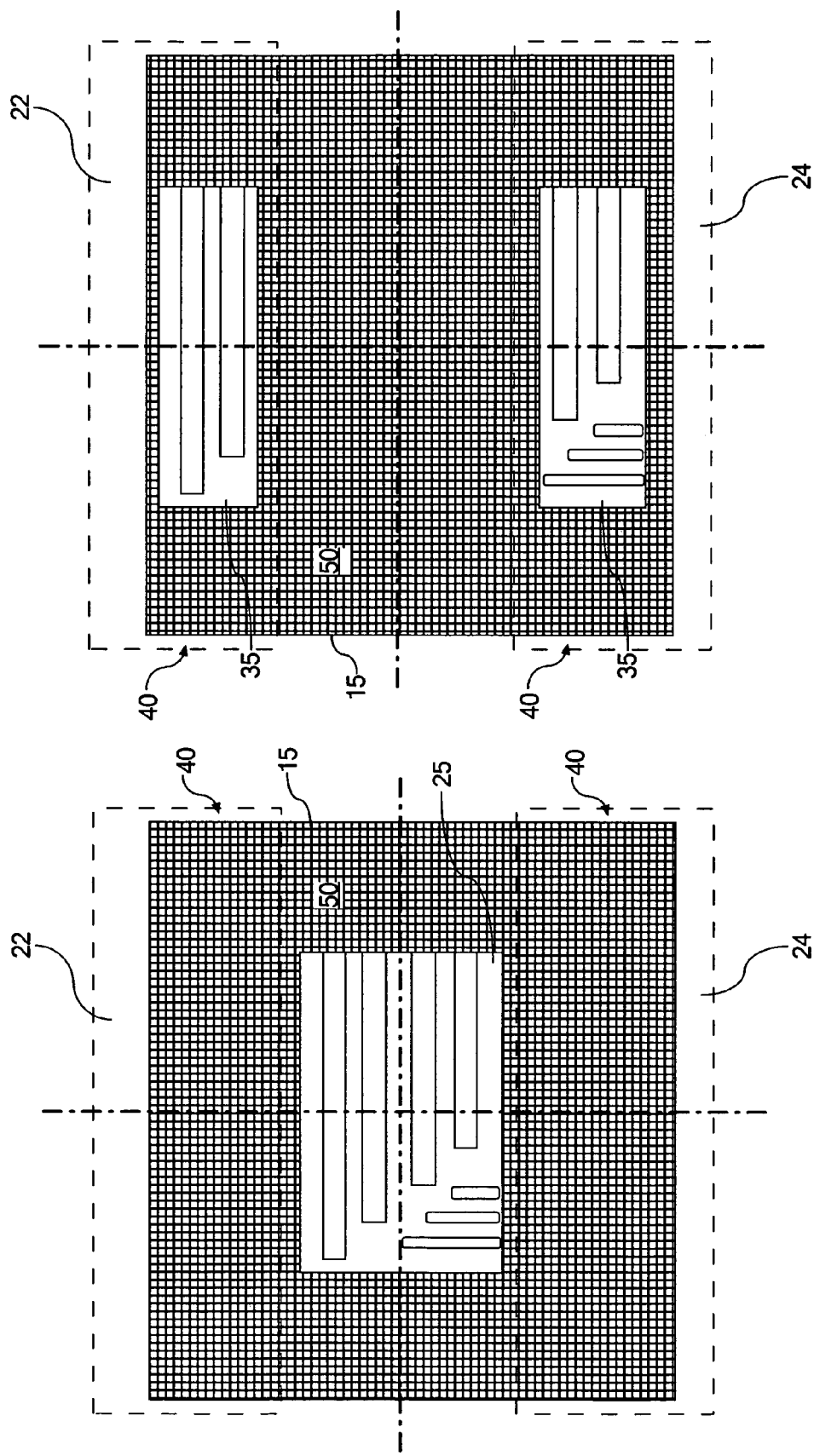

MULTI-MODE CHARGED PARTICLE BEAM DEVICE

CROSS-REFERENCE TO RELATED APPLICATIONS

This application claims the benefit of U.S. Provisional Application Ser. No. 60/492,138 filed Aug. 1, 2003.

BACKGROUND OF THE INVENTION

The present invention relates to charged particle beam devices and, more particularly, to charged particle beam devices used to generate images of specimens under examination.

BRIEF SUMMARY OF THE INVENTION

Although the present invention relates generally to the use of charged particles in generating an image that represents one or more characteristics of a specimen under examination, the present invention will be described in the context of transmission electron microscopes.

Transmission electron microscopes use a beam of accelerated electrons that pass through a specimen to provide an image representing the specimen. The image may be a single or multi-dimensional image, a diffraction pattern, a spectrum, or any other suitable representation of the specimen. To provide a record of these images, electrons are converted into light images using a scintillator and a camera then captures the light images. While photographic film has long been used to capture such images, charge coupled devices (CCDs) have found increasing use in this field. Such CCD cameras offer excellent resolution, sensitivity, and linearity, are reusable, and make the image available for viewing within seconds of recording.

With the advent of digital image processing in transmission electron microscopy, such CCD cameras have been used to transfer images directly from the microscope to a computer. Typically, the electron image is converted to a light image by means of a scintillator such as a phosphor screen mounted inside the transmission electron microscope. The light image is then transferred to a CCD pixel array, also located inside of the microscope, using a lens or fiber optic coupling. The image collected by the camera is then digitized electronically and stored in a computer where it can be manipulated and viewed with the aid of appropriate software.

CCD cameras and other imaging devices according to the present invention may operate in either a full frame mode or frame transfer mode. In the full frame mode, the image is exposed onto a relatively large active area of the detector, and the electron beam is then blanked (such as by using a shutter to remove the illumination). The pixels on the detector are then read out and stored. In full frame mode, substantially all of the available detector pixels are used for imaging, which allows for a high quality image. When this cycle of exposure and blanking is repeated in a continuous mode at low exposure times, i.e. high frame rates, the active duty cycle for the camera becomes relatively low. That is, the duty cycle of the camera is the fraction of time that imaging can take place with respect to the total time required for the imaging and read out cycle to take place.

In the frame transfer mode, a mask is placed on the CCD such that the imaging detector of the camera has a portion (e.g., approximately 50%) of the area masked from electron or photon illumination. The camera is operated in a continuous mode where the image is always being exposed in the unmasked imaging area. After exposure, the image is shifted by rapidly moving it to the area on the CCD behind the mask and is read out and stored.

Typically, shifting the image is many times faster than reading it out. In frame transfer mode, the image detector has only half the pixels available for imaging but has a higher duty cycle. The only non-imaging time in the cycle is the transfer of electrical charges to and from the imaging area to the memory area of the detector. Shuttering the beam during image shifting under the mask may not be needed if the shifting process is rapid enough.

The present invention addresses the trade-off with respect to the high quality images and low duty cycles of the full frame mode and the high duty cycles and lower resolutions of the frame transfer mode. Charged particle imaging devices according to the present invention are not limited to a single mode of operation and there is no need to change cameras to account for the needs of the particular project because imaging devices according to the present invention are capable of operation in a plurality of modes and can be converted from operation in one mode to another quickly.

The present invention meets those needs by providing a camera that can be operated in at least two different modes and that can be quickly converted from operation in one mode to another. In accordance with one aspect of the present invention, a camera is provided having an imaging detector with an imaging area. In a preferred mode, the imaging detector comprises a charge-coupled device (CCD) having a pixel-receiving array. In other embodiments of the invention, the imaging detector may comprise a photodiode array, a CMOS detector, or other imaging device that can convert photons into electrical charges.

The camera includes a mask that is capable of being manipulated to permit an image to be received by the full surface area of the imaging detector and then further manipulated to cover or block at least a portion of the area of the image receiving detector from receiving an image. The mask may be either a mechanical mask, a virtual mask implemented using suitable software to manipulate the optics of the system to prevent the image from reaching a portion of the imaging detector, or any other suitable means for restricting an area of the imaging detector from receiving an image.

Where the mask is a mechanical mask, it is preferably constructed of a low Z (i.e., low atomic number) material such as, for example, aluminum. The use of low Z materials for the mechanical mask provides the additional benefit of reducing the amount of hard X-rays emitted from the mask, making X-ray shielding of the imaging detector simpler. This in turn reduces any problems associated with X-ray emissions causing false signals to register on the imaging detector.

In one embodiment, the mechanical mask comprises a pair of shutters located on either side of the imaging detector. The halves of the mask are driven using suitable mechanical, electrical, or hydraulic motive power. The mask is movable from at least a first position where the mask does not interfere with the imaging detector (e.g., the entire surface of the imaging detector is uncovered) to at least a second position where at least a portion of the imaging detector is covered such that at least a portion of the image does not reach the masked off portion of the detector.

In the full frame mode, the image is exposed onto the full area of the detector, and the electron beam is then blanked (such as by using a shutter to remove the illumination). The pixels on the detector are then read out and stored. In full frame mode, all of the available pixels on the device are used for imaging, which allows for a high quality image.

In the frame transfer mode, the imaging detector of the camera has a portion (e.g., approximately 50%) of the area masked from electron or photon illumination. In the embodiment of the invention using a mechanical mask, this is accomplished by moving the mask to cover a predetermined percentage of the surface area of the imaging detector. In the embodiment of the invention using a virtual mask, the optics of the system are manipulated to mask of a predetermined percentage of the surface area of the imaging detector. The camera is operated in a continuous mode where the image is always being exposed in the unmasked imaging area. After exposure, the image is rapidly moved to a memory area on the camera behind the mask and is read out and stored.

In a pipelined frame transfer mode mode, the image may be an asymmetric spectrum that is exposed on a narrow area of the imaging detector. This mode is typically used in conjunction with a spectrometer. In one embodiment, using a 2048×2048 pixel CCD device, only the middle 200×2048 pixels of the detector are illuminated. The remainder of the surface area of the detector is masked. After the spectrum exposure is complete, the image of the spectrum is transferred along the detector to an area just outside the portion on which the spectrum has been exposed. In this way many spectra, typically 1 to 10, can be exposed on the detector in a "pipeline" before the first spectrum is read out. As moving charge across the full surface area of the detector can take a considerable amount of time, this pipelining allows for much faster frame rates for spectroscopy uses.

Imaging devices according to the present invention are versatile in operation and can be used in conjunction with a number of electron microscope configurations. For example, the camera may be positioned at the bottom of a transmission electron microscope (TEM) column or in the 35 mm camera port on the side of the microscope column. The camera may also be used in conjunction with an imaging filter or an electron energy loss spectrometer (EELS) to capture images.

Accordingly, it is a feature of the present invention to provide a camera that can be operated in at least two different modes and that can be quickly converted from operation in one mode to another. This and other features and advantages of the invention will become apparent from the following detailed description, and the accompanying drawings.

In accordance with one embodiment of the present invention, a charged particle device is provided comprising a charged particle source configured to direct charged particles in the direction of a specimen under examination and an imaging device configured to convert charged particles to an image representing the specimen. The imaging device comprises a detector defining a pixel array. The detector is configured to generate electric charges for individual pixels of the pixel array such that the electric charges collectively define the image. The imaging device is configured such that a portion of the pixel array can be transitioned between a partially masked state and a substantially unmasked state. The partially masked state defines a set of masked readout pixels and a set of unmasked imaging pixels. The set of masked readout pixels occupies a portion of the pixel array that is large enough to accommodate image data held in the unmasked imaging pixels. The imaging device is programmed to operate in a full frame imaging mode when the pixel array is in the substantially unmasked state and in a frame transfer imaging mode when the pixel array is in the partially masked state. The device may also operate in a pipelined frame transfer mode when the pixel array is in the partially masked state.

In accordance with another embodiment of the present invention, a charged particle device is provided comprising a specimen holder, a charged particle source, an imaging device, and a user interface. The specimen holder defines a specimen position and the charged particle source is configured to direct charged particles in the direction of the specimen position. The imaging device is configured to convert charged particles to an image representing a specimen held in the specimen position. The detector is configured to generate electric charges for individual pixels of the detector pixel array such that the electric charges collectively define the image. The user interface is configured to enable selection from at least two operating modes comprising a frame transfer mode and a full frame mode. The imaging device is configured to transition the pixel array between a partially masked state in the frame transfer mode and a substantially unmasked state in the full frame mode.

In accordance with yet another embodiment of the present invention, a method of operating a charged particle device is provided. The device is configured to direct charged particles in the direction of a specimen under examination and convert the charged particles to an image representing the specimen. The charged particle device comprises a user interface and a controller programmed to prompt a user to select one of a plurality of imaging modes via the user interface. A portion of the pixel array is transitioned between a partially masked state and a substantially unmasked state as a function of the imaging mode selected via the user interface.

Accordingly, it is an object of the present invention to provide an improved charged particle device. Other objects of the present invention will be apparent in light of the description of the invention embodied herein.

BRIEF DESCRIPTION OF THE SEVERAL VIEWS OF THE DRAWINGS

The following detailed description of specific embodiments of the present invention can be best understood when read in conjunction with the following drawings, where like structure is indicated with like reference numerals and in which:

FIGS. 4 and 5 are illustrations of a frame transfer mode according to one embodiment of the present invention;

DETAILED DESCRIPTION

Figure 2:
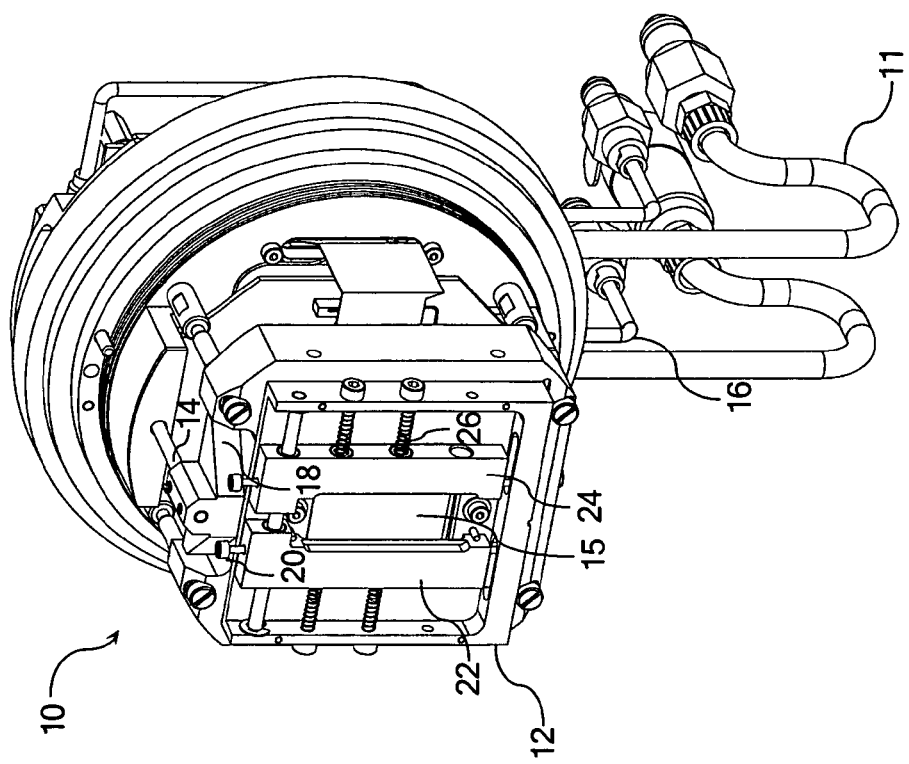
FIG. 2 is an isometric view of an imaging device according to the present invention in a partially masked state.
Figure 1:
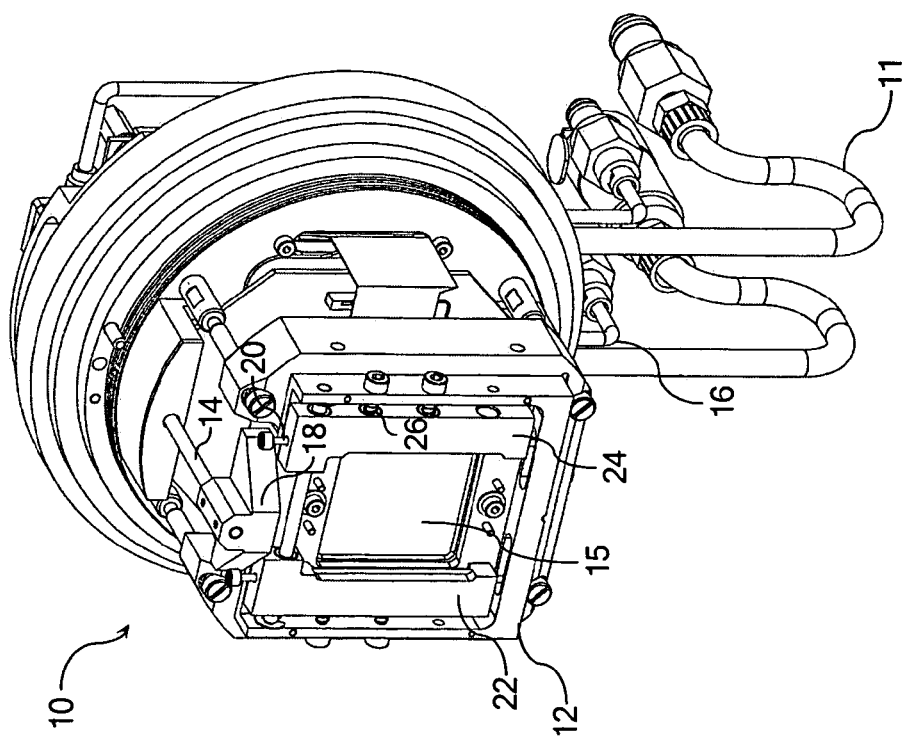
FIG. 1 is an isometric view of an imaging device according to the present invention in a substantially unmasked state.

FIGS. 1 and 2 illustrate one embodiment of the invention in which the imaging device 10, typically including a CCD imaging detector 15, is cooled by water from cooling lines 11. Imaging device 10 includes a mechanical mask 12 selectively movable across the pixel array of the CCD detector 15. In FIG. 1, the mechanical mask 12 is illustrated in an open position Such as would be used when the imaging device 10 is operated in the full frame mode. In FIG. 2, the mechanical mask 12 is illustrated in a partially closed position such as would be used when the imaging device 10 is operated in the frame transfer mode.

As can be seen, the mask includes a movable piston 14 driven by pneumatic pressure supplied from line 16. Application of pneumatic pressure causes piston 14 to move. A pair of wedge-shaped cams 18 located on either side of piston 14 ride against pins 20, located on opposing halves 22 and 24 of mask 12. As piston 14 moves, the cams, in conjunction with the pins overcome the bias of springs 26 and cause the respective mask halves to retract, exposing additional surface area of the detector 15.

The mechanical mask 12 may be constructed of a low Z material, i.e., a low atomic weight material. The use of low Z materials for the mechanical mask provides the additional benefit of reducing the amount of hard X-rays emitted from the mask, making X-ray shielding of the imaging detector simpler. This in turn reduces any problems associated with X-ray emissions causing false signals to register on the imaging detector. Aluminum is a suitable material to construct mask 12. Heavier atomic weight metals such as tungsten do not provide the low X-ray properties of aluminum.

Figure 3:
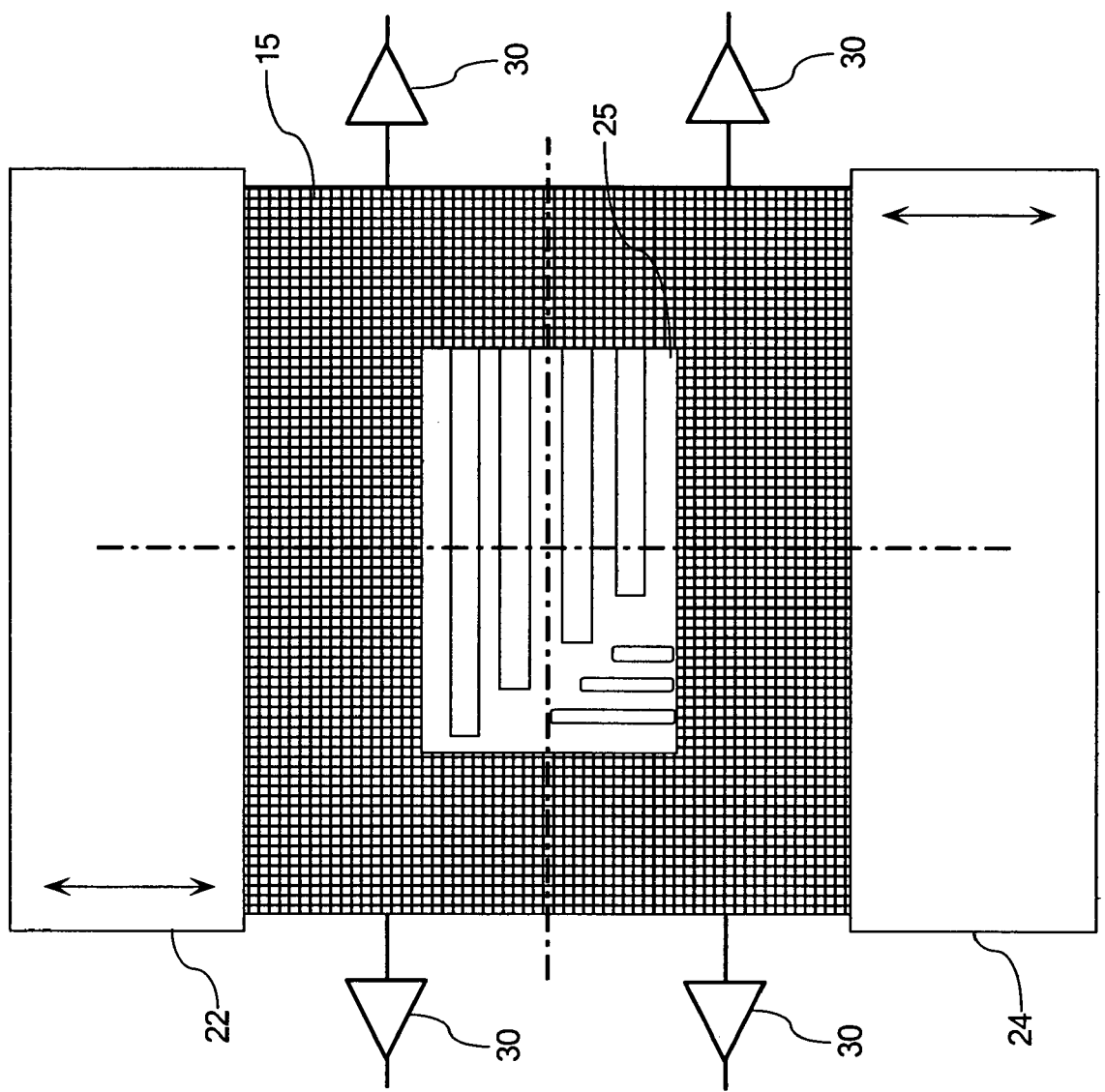
FIG. 3 is an illustration of a full frame mode according to the present invention.

Refeffing to FIG. 3, in typical full frame operation, the full surface area of the detector 15 is available for sensing during exposure. During readout of the image 25, charge is shifted sequentially across the pixel array of the detector 15 to designated readout cells coupled to one or more signal output amplifiers 30. In the embodiment of FIG. 3, the pixel array of the detector 15 is divided into quadrants, each coupled to an independent signal output amplifier 30. During readout, a mechanical shutter or other suitable means in the system blocks any incoming charged particles from reaching the detector.

The full frame mode uses substantially all of the pixels in the array of the detector 15. The pixels are typically square so that there is no image distortion. In general, and by way of example, not limitation, the array undergoes readout by shifting individual rows of images in sequence in parallel fashion to a serial shift register coupled to an output amplifier 30. The serial shift register then sequentially shifts each row of image information to the amplifier as a serial data stream. The process is repeated until all rows of image data are transferred to the output amplifier 30 and then to an analog to digital converter circuit. Reconstruction of the image 25 in a digital format yields the final image.

Referring to FIGS. 4 and 5, in the frame transfer mode, a portion of the pixel array is masked to define a set of masked readout pixels 40 and a set of unmasked imaging pixels 50. The image 25 is captured on the unmasked area of the array while the masked portion serves as a storage array for a transferred image 35. Once captured, the charges representing the image 25 are transferred from the unmasked imaging pixels 50 to the storage area defined by the masked readout pixels 40. Once in the storage area, the charges are transferred off of the pixel array in much the same way as the full frame mode operation described above. Specifically, the detector array undergoes readout by shifting rows of image information in a parallel fashion, one row at a time, to a serial shift register. The serial register then sequentially shifts each row of information to an output amplifier as a serial data stream. During the period in which the readout pixels 40 are being read, the imaging pixels 50 (i.e., the unmasked portion of the detector) is exposed to another image frame. This mode of operation permits faster frame rates and increased duty cycles. It is noted that the multiple modes of operation of the imaging device of the present invention may be controlled by running parallel and serial clock lines in different sequences for the different modes. Such operation can be facilitated by controlling voltages using a digital signal processor (DSP).

Figure 7:
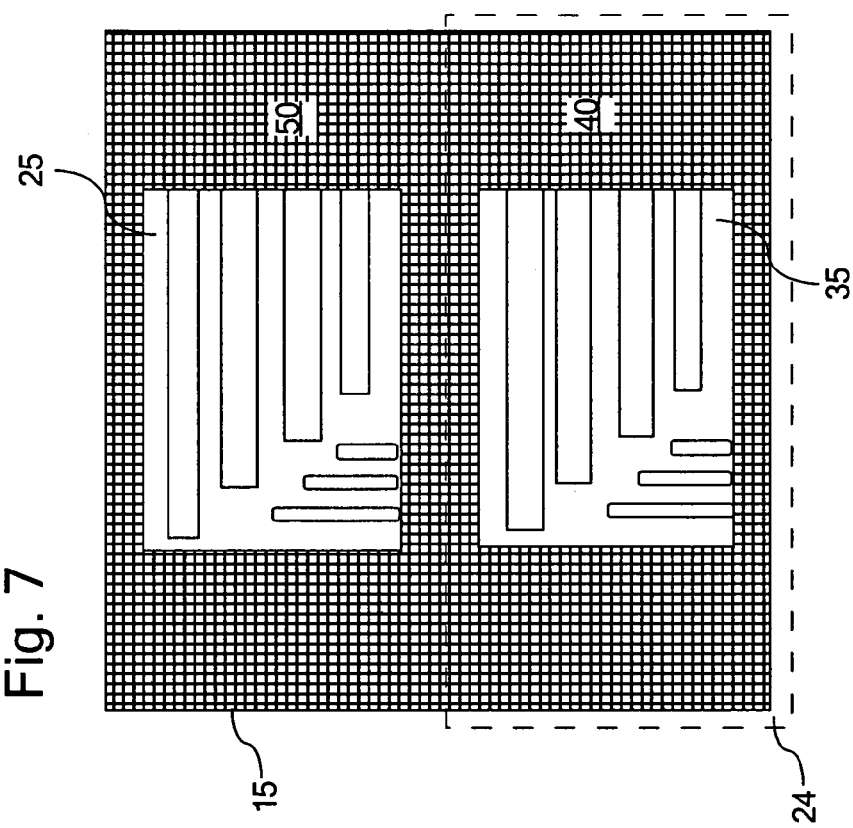
FIGS. 6 and 7 illustrate a full frame mode and a frame transfer mode according to another embodiment of the present invention.
Figure 6:
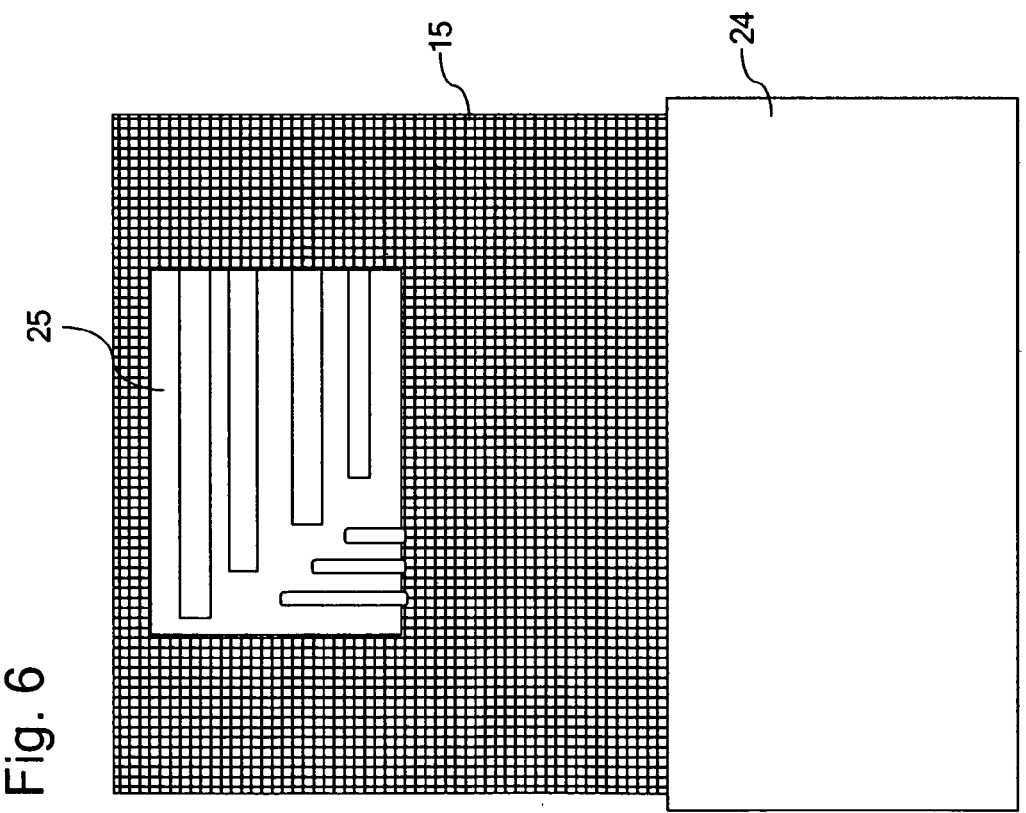

It is also noted that, the embodiment of FIGS. 4 and 5 illustrates a pixel array that is defined in four quadrants, with each quadrant of the array including masked readout pixels 40 and unmasked imaging pixels 50. It is contemplated, however, that imaging devices according to the present invention may incorporate pixel arrays configured for readout in a variety of ways. For example, FIGS. 6 and 7 illustrate the full frame mode and the frame transfer mode of the present invention in the context of a pixel array 15 that merely includes a single area of masked readout pixels 40 and a single area of unmasked imaging pixels 50, as opposed to respective quadrants of readout and imaging pixels.

Figure 8:
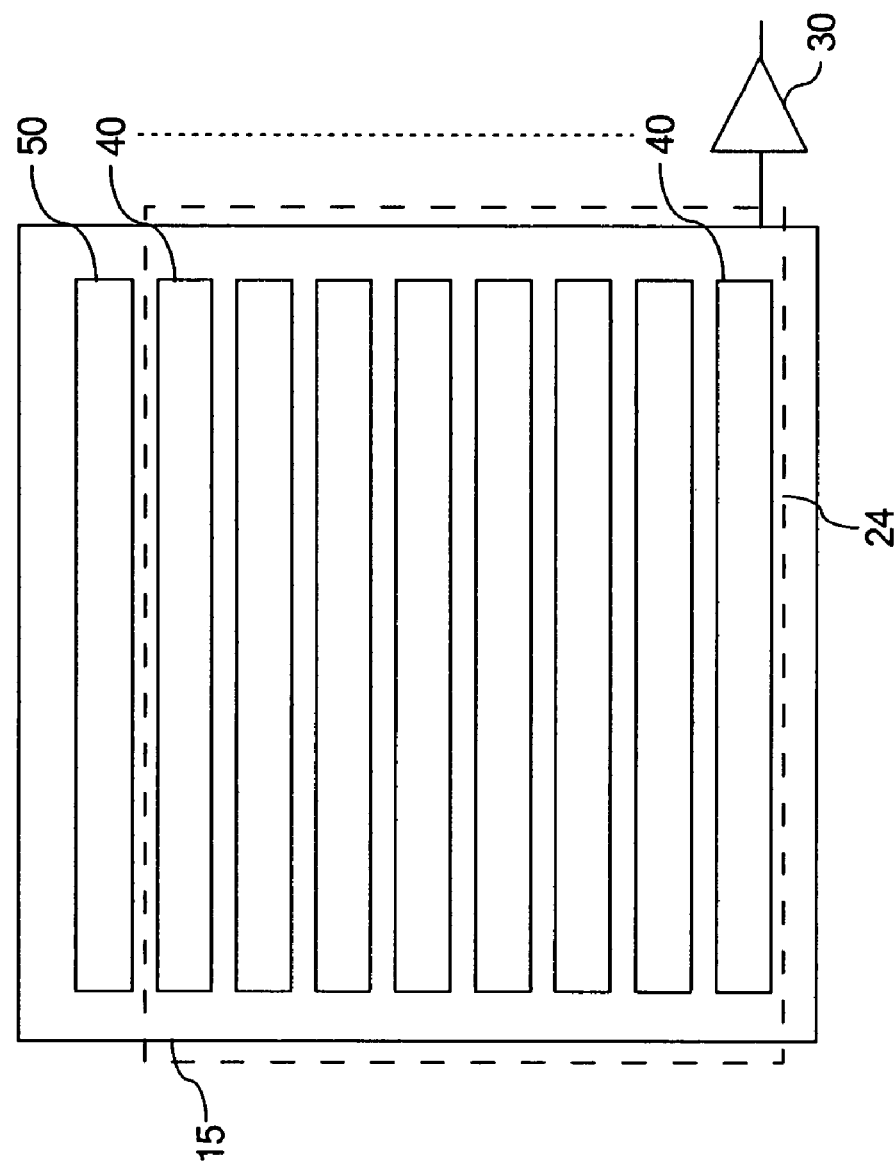
FIG. 8 is an illustration of a pipelined frame transfer mode according to the present invention.

Referring to FIG. 8, to operate an imaging device according to the present invention in a pipelined frame transfer mode, the mask 24 is positioned so that the image, which in the illustrated embodiment comprises a spectrum, is exposed onto only a relatively narrow area of unmasked imaging pixels 50 of the imaging detector 15. This mode is typically used in conjunction with a spectrometer. In one embodiment using a 2048×2048 pixel CCD device, only the middle 200×2048 pixels of the detector are illuminated. The remainder of the surface area of the detector is mechanically masked or virtually masked using software to modify the spectrometer electron optics. After the spectrum exposure is complete, the image of the spectrum is transferred along the detector to an adjacent equivalent area of masked imaging pixels 40 just outside the portion on which the spectrum has been exposed. Subsequent image transfer occurs in a progressive manner until image data is read out by the signal output amplifier 30 coupled to the final area of masked pixels 40 in the pipeline. In this way many spectra, typically 1 to 10, can be exposed on the detector in a "pipeline" before the first spectrum is read out by the signal output amplifier 30. As moving charge across the full surface area of the detector can take a considerable amount of time, this pipelining allows for much faster frame rates for spectroscopy uses.

Figure 9:
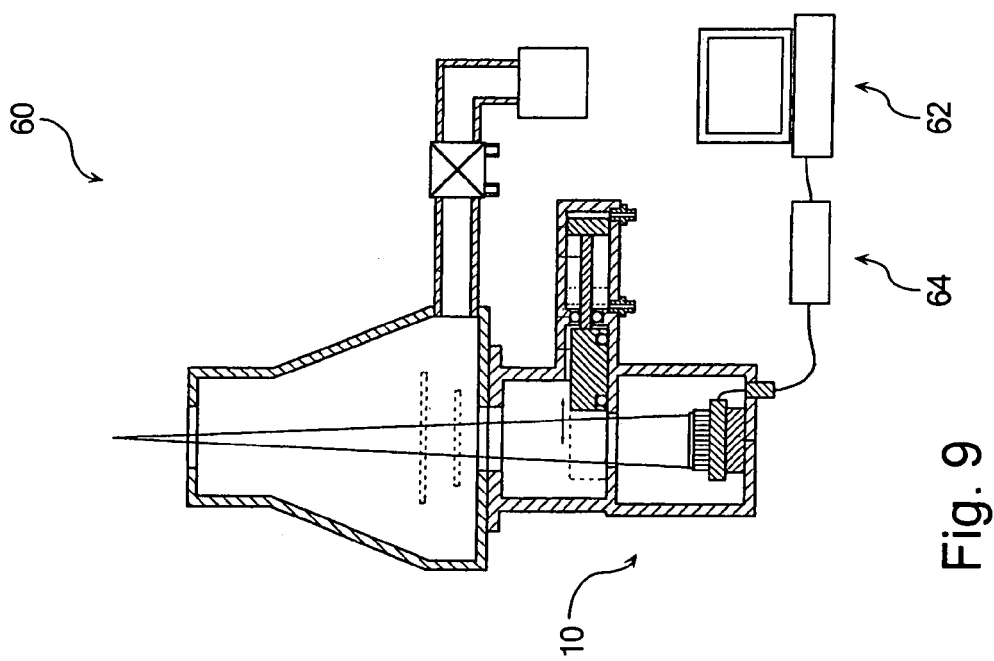
FIG. 9 is a schematic illustration of one embodiment of the imaging device of the present invention mounted at the bottom of a TEM column.

Imaging devices according to the present invention may be used in conjunction with a variety of charged particle beam systems. For example and by way of illustration, not limitation, as shown schematically in FIG. 9, an imaging device 10 according to the present invention may be mounted in the bottom of a TEM column 60, such as, for example, the TEM described in Krivanek, U.S. Pat. No. 5,065,029, the entire disclosure of which is hereby incorporated by reference. FIG. 9 also illustrates the use of a user interface 62 and a controller 64 programmed to prompt a user to select one of a plurality of imaging modes via the user interface 62. It is noted that the user interface 62 and the controller 64 may take a variety of suitable forms and may be utilized in a variety of embodiments of the present invention.

Figure 10:
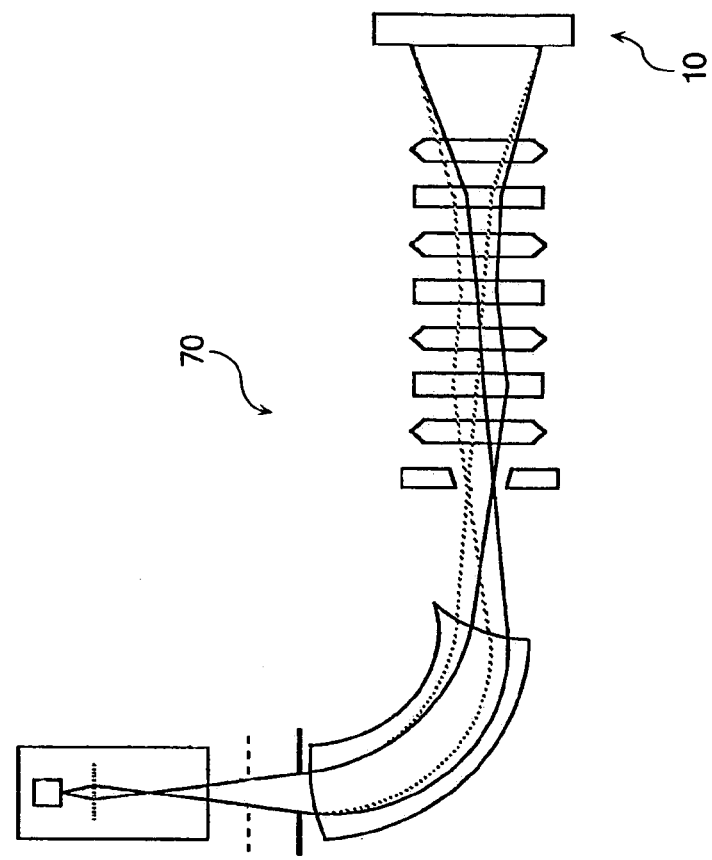
FIG. 10 is a schematic illustration of one embodiment of the imaging device of the present invention mounted at the end of an imaging filter.

As a further example, referring to the schematic illustration of FIG. 10, an imaging device 10 according to the present invention may be mounted to the end of an imaging filter 70, such as, for example, the energy-selected electron imaging filter described in Krivanek, U.S. Pat. No. 4,851,670, the entire disclosure of which is hereby incorporated by reference.

Figure 11:
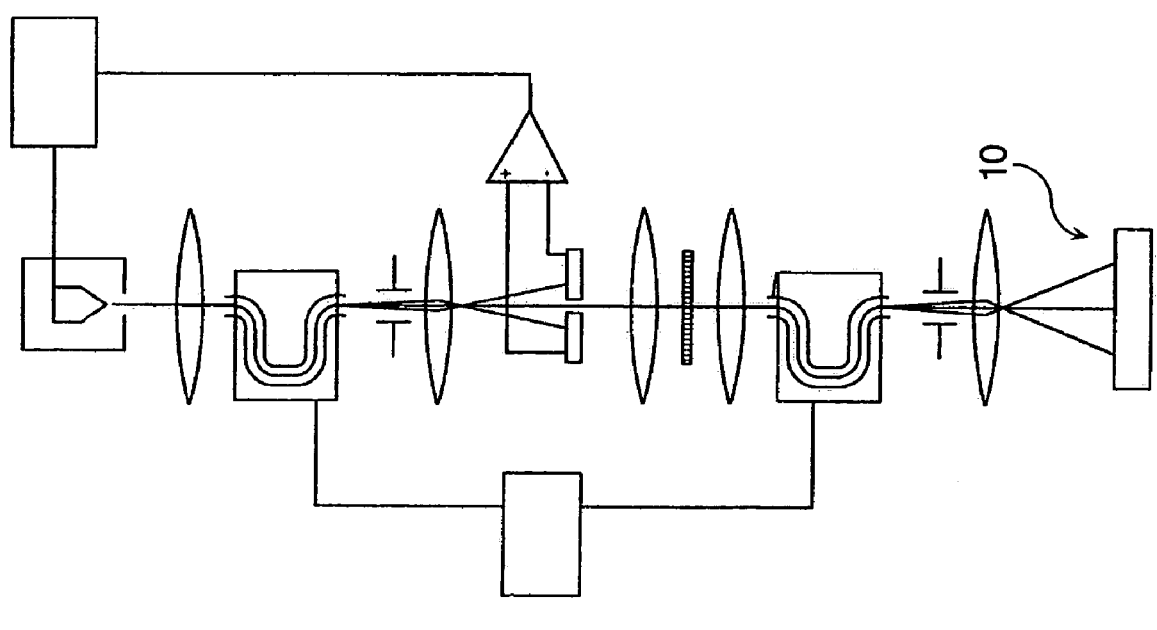
FIG. 11 is a schematic illustration of one embodiment of the imaging device of the present invention mounted at the end of an electron energy loss spectrometer.

In yet another embodiment of the invention schematically illustrated in FIG. 11, an imaging device 10 of the present invention may be mounted on the end of an electron energy loss spectrometer (EELS) 80, such as, for example, the EELS device described in Krivanek, U.S. Pat. No. 5,097,126, the entire disclosure of which is hereby incorporated by reference.

Embodiments of the imaging device of the present invention are capable of multiple modes of operation. This allows high quality images to be captured and fast viewing of captured images with high duty cycles, thereby providing high sensitivity and fast spectra readout using the same device. To achieve these features, a real or virtual removable mask to adjustably shield a portion of the imaging detector is used. Additionally, multiple methods of moving the charge on the imaging detector are used. In many cases the detector will be a CCD, although other suitable detectors can be used, for example a photodiode array or a CMOS detector.

It is noted that terms like "preferably," "commonly," and "typically" are not utilized herein to limit the scope of the claimed invention or to imply that certain features are critical, essential, or even important to the structure or function of the claimed invention. Rather, these terms are merely intended to highlight alternative or additional features that may or may not be utilized in a particular embodiment of the present invention.

For the purposes of describing and defining the present invention it is noted that the term "substantially" is utilized herein to represent the inherent degree of uncertainty that may be attributed to any quantitative comparison, value, measurement, or other representation. The term "substantially" is also utilized herein to represent the degree by which a quantitative representation may vary from a stated reference without resulting in a change in the basic function of the subject matter at issue.

Having described the invention in detail and by reference to specific embodiments thereof, it will be apparent that modifications and variations are possible without departing from the scope of the invention defined in the appended claims. More specifically, although some aspects of the present invention are identified herein as preferred or particularly advantageous, it is contemplated that the present invention is not necessarily limited to these preferred aspects of the invention.

What is claimed is:

1. A charged particle device comprising a charged particle source configured to direct charged particles in the direction of a specimen under examination and an imaging device configured to convert charged particles to an image representing said specimen, wherein:

said imaging device comprises a detector defining a pixel array;

said detector is configured to generate electric charges for individual pixels of said pixel array such that said electric charges collectively define said image;

said imaging device is configured such that a portion of said pixel array can be transitioned between a partially masked state and a substantially unmasked state;

said partially masked state defines a set of masked readout pixels and a set of unmasked imaging pixels;

said imaging device is programmed to operate in a frame transfer imaging mode when said pixel array is in said partially masked state and in a full frame mode when said pixel array is in said substantially unmasked state;

said frame transfer imaging mode is configured such that an image captured by said set of unmasked imaging pixels is transferred to said set of masked readout pixels, said transferred image is subsequently transferred from said set of masked readout pixels to storage outside of said pixel array as a subsequent image is captured by said set of unmasked imaging pixels, and said subsequently captured image is transferred to said set of masked readout pixels after said initial image is transferred from said set of masked readout pixels to said outside storage; and said full frame mode is configured such that an image captured by said pixel array in said substantially unmasked state is transferred to storage outside of said pixel array as incoming charged particles are blocked from reaching said detector.

2. A charged particle device as claimed in claim 1 wherein said frame transfer imaging mode is configured such that approximately 50% of said pixel array is dedicated to said set of unmasked imaging pixels.

3. A charged particle device as claimed in claim 1 wherein said frame transfer imaging mode is configured such that substantially equal portions of said pixel array are dedicated to said respective sets of masked and unmasked pixels.

4. A charged particle device as claimed in claim 1 wherein said frame transfer imaging mode is configured such that said set of unmasked imaging pixels is positioned between respective portions of said set of masked readout pixels along a pixel plane defined by said pixel array.

5. A charged particle device as claimed in claim 1 wherein said frame transfer imaging mode is configured such that said set of unmasked imaging pixels is defined in a central portion of said pixel array and said set of masked readout pixels is defined in lateral portions of said pixel array.

6. A charged particle device as claimed in claim 1 wherein:

said imaging device comprises a mechanical mask movable between a first position corresponding to said substantially unmasked state to a second position corresponding to said partially masked state; and said mechanical mask comprises a pair of shutters mounted to move towards and away from one another across said pixel array.

7. A charged particle device as claimed in claim 1 wherein said charged particle beam device further comprises system optics and said imaging device comprises a virtual mask implemented through the manipulation of said system optics to prevent charged particles from reaching a portion of said imaging device corresponding to said set of masked readout pixels.

8. A charged particle device as claimed in claim 1 wherein said charged particle device further comprises a user interface and a controller programmed to prompt a user to select one of a plurality of imaging modes via said user interface.

9. A charged particle device as claimed in claim 1 wherein said charged particle device further comprises a controller programmed to affect said transition of said pixel array between said partially masked state and said substantially unmasked state.

10. A charged particle device as claimed in claim 1 wherein said imaging device is configured such that said pixel array can be transitioned from said partially masked state to said substantially unmasked state without substantial interruption to operation of said device.

11. A charged particle device as claimed in claim 1 wherein said charged particle source is configured to generate a beam of charged particles comprising electrons, protons, ions, or combinations thereof.

12. A charged particle device as claimed in claim 1 wherein said charged particles comprise electrons characterized by a kinetic energy of at least about 1 keV.

13. A charged particle device as claimed in claim 1 wherein said charged particle device comprises an electron microscope.

14. A charged particle device as claimed in claim 13 wherein said electron microscope further comprises an electron energy loss spectrometer.

15. A charged particle device as claimed in claim 1 wherein said imaging device comprises said detector and one or more components selected from an energy selecting slit, a charged particle dispersing device, a charged particle lens, a charged particle deflector, a charged particle energy filter, a charged particle scintillator, and a fiber optic coupler.

16. A charged particle device as claimed in claim 1 wherein said detector comprises a CCD array, a photodiode array, or a CMOS detector.

17. A charged particle device as claimed in claim 1 wherein said image represents dimensional bounds of said specimen, physical properties of said specimen, material constituents of said specimen, or combinations thereof.

18. A charged particle device as claimed in claim 6 wherein said mechanical mask comprises a movable piston, a cam assembly, and at least one biasing spring configured such that application of pressure causes said piston to move said cam assembly so as to overcome the bias of said spring and cause the respective shutters to retract, exposing additional surface area of said pixel array.

19. A charged particle device as claimed in claim 18 wherein said cam assembly is configured such that said exposure of said additional surface area attributable to respective ones of said pair of shutters is substantially equivalent.

20. A charged particle device as claimed in claim 19 wherein said cam assembly comprises a pair of wedge-shaped cams.

21. A charged particle device as claimed in claim 6 wherein said set of masked readout pixels and said set of unmasked imaging pixels define substantially equal portions of said pixel array.

22. A charged particle device as claimed in claim 6 wherein a portion of said mechanical mask defining said masked readout pixels comprises a shielding material characterized by an atomic number of below about 30 in an amount sufficient to render the amount of hard X-rays emitted from said mask and reaching said pixel array to an insubstantial amount during operation of said device.

* * * * *